(12) United States Patent
Giannetti

(10) Patent No.: US 12,375,035 B2
(45) Date of Patent: Jul. 29, 2025

(54) COOLING SYSTEM FOR PHOTOVOLTAIC PANELS

(71) Applicant: Emanuele Giannetti, Turin (IT)

(72) Inventor: Emanuele Giannetti, Turin (IT)

( * ) Notice: Subject to any disclaimer, the term of this patent is extended or adjusted under 35 U.S.C. 154(b) by 15 days.

(21) Appl. No.: 18/371,094

(22) Filed: Sep. 21, 2023

(65) Prior Publication Data

US 2024/0106392 A1 Mar. 28, 2024

(51) Int. Cl.
*H02S 40/42* (2014.01)
*H02S 10/10* (2014.01)
*H02S 50/00* (2014.01)
*H10F 77/63* (2025.01)

(52) U.S. Cl.
CPC ........... *H02S 40/425* (2014.12); *H02S 10/10* (2014.12); *H02S 50/00* (2013.01); *H10F 77/68* (2025.01)

(58) Field of Classification Search
CPC ....... H01L 31/00–078; Y02E 10/50–60; H02S 40/40–425; H10F 77/60–68
USPC ................................................ 136/243–265
See application file for complete search history.

(56) References Cited

U.S. PATENT DOCUMENTS

| | | | | |
|---|---|---|---|---|
| 2004/0025931 | A1* | 2/2004 | Aguglia | F24S 10/17 136/246 |
| 2010/0170561 | A1* | 7/2010 | Peng | H10F 77/68 136/246 |
| 2011/0197943 | A1* | 8/2011 | Pleva | F24S 10/60 136/244 |
| 2016/0211796 | A1* | 7/2016 | Hammad | B08B 3/04 |

FOREIGN PATENT DOCUMENTS

| | | |
|---|---|---|
| CN | 211701969 U | 10/2020 |
| IT | T020110344 A1 | 10/2012 |
| IT | TO20110344 A1 * | 10/2012 |
| JP | H07240532 A * | 9/1995 |
| JP | 2011146442 A | 7/2011 |
| WO | 2011004411 A2 | 1/2011 |

OTHER PUBLICATIONS

IT-TO20110344-A1 English (Year: 2012).*
JP-H07240532-A English (Year: 1995).*

* cited by examiner

*Primary Examiner* — Bach T Dinh
(74) *Attorney, Agent, or Firm* — CANTOR COLBURN LLP

(57) ABSTRACT

A method for controlling a cooling system for photovoltaic panels is provided. The cooling system has a water cooling assembly adapted to produce a cooling water flow wetting an upper surface of a photovoltaic panel exposed to solar light, an air cooling assembly adapted to produce an air flow directed against the upper surface of the photovoltaic panel, a set of sensors and electric power meters, and an electronic control unit configured to receive input information regarding values of a set of control parameters and to automatically control activation of the water cooling assembly and of the air cooling assembly according to predetermined modes of operation depending on values of the control parameters.

7 Claims, 2 Drawing Sheets

COOLING SYSTEM FOR PHOTOVOLTAIC PANELS

CROSS-REFERENCE TO RELATED APPLICATION

This application claims priority to Italian Patent Application No. 102022000019887 filed on Sep. 28, 2022, the contents of which are incorporated by reference in their entirety.

FIELD OF THE INVENTION

The present invention relates to a cooling system for photovoltaic panels.

BACKGROUND OF THE INVENTION

Cleaning systems for photovoltaic panels are known which allow for the surface of the panels that is exposed to solar light to be cleaned automatically. An example of a cleaning system for photovoltaic panels is provided by WO2011/004411. According to said patent document, the cleaning system comprises a tube which is arranged above the panel, at some distance therefrom, and extends along a first direction parallel to one of the sides of the panel. The tube is mounted so as to be slidable along a second direction perpendicular to the first direction and parallel to the surface of the panel and is controlled in translation along the second direction so as to move alternately from one end of the panel to the other. The tube has a plurality of nozzles, each connected to both a source of water and a source of pressurized air. The operation of the cleaning system is managed automatically by a programmable electronic control unit in such a way that the tube with the nozzles is connected alternately to the water source during a forward movement of the tube and to the pressurized air source during the subsequent return movement of the tube. In the case of a panel having an inclined arrangement, the cleaning system is controlled so as to deliver, through the nozzles of the tube, water during the movement of the tube from the lower end to the upper end of the panel and pressurized air during the movement of the tube from the upper end to the lower end of the panel.

The document cited above does not mention or suggest the possibility of using the cleaning system for the purposes of cooling the panel.

A rise in the operating temperature of the silicon contained in a photovoltaic panel as a result of the solar irradiation is a problem for both the proper functioning and the integrity of the panel, as it leads on the one hand to the decline of the panel's performance, i.e., the reduction of the effective power output of the panel, and on the other hand to the physical degradation of the silicon contained in the panel. Published Italian application No. TO2011A000344, owned by the instant Applicant, describes a method which makes it possible to ensure that the panel always operates below a given maximum operating temperature in order to maintain high performance and ensure the physical integrity of the panel for as long as possible. This method, however, does not allow for a direct control over the electric power produced by the panel.

SUMMARY OF THE INVENTION

The object of the present invention is to provide a method to more effectively manage the cooling system for photovoltaic panels.

This and other objects are fully achieved according to the present invention by a method for controlling a cooling system for photovoltaic panels having the features described and claimed herein.

Preferred embodiments of the cooling system according to the present invention are also described.

In summary, the present invention is based on a method for controlling a cooling system for photovoltaic panels comprising:

an air cooling assembly adapted to produce an air flow directed against the surface of the panels exposed to solar light (or against a second surface opposite the first), and comprising at least one fan driven by a first electric motor, a water cooling assembly adapted to produce a cooling water flow wetting the surface of the panels exposed to solar light, and comprising at least one pump driven by a second electric motor, and measuring means comprising a produced power meter adapted to measure the electric power produced as output by the panel, a first absorbed power meter adapted to measure the electric power absorbed as input by the first electric motor, and a second absorbed power meter adapted to measure the electric power absorbed as input by the second electric motor, wherein the method comprises the steps of:
a) switching on the fan,
b) calculating the difference between the electric power produced as output by the panel and the electric power absorbed as input by the first electric motor, hereinafter first power difference, based on the signals received from the produced power meter and the first absorbed power meter,
c) keeping the fan in operation during a first time interval $\Delta t1$ after the fan has been switched on, during which said first power difference is negative,
d) in a second time interval $\Delta t2$ following the first time interval $\Delta t1$, keeping the fan in operation until said first power difference is positive,
e) when the first power difference drops to zero, switching off the fan and switching on the pump,
f) calculating the difference between the electric power produced as output by the panel and the electric power absorbed as input by the second electric motor, hereinafter second power difference, based on the signals received from the produced power meter and the second absorbed power meter,
g) keeping the pump in operation during a first time interval $\Delta T1$ after the pump has been switched on, in which said second power difference is negative,
h) in a second time interval $\Delta T2$ following the first time interval $\Delta T1$, keeping the pump in operation until said second power difference is positive,
i) when the second power difference drops to zero, switching off the pump and switching on the fan.

With respect to the method known from published Italian application No. TO2011A000344, the method according to the present invention allows for (also) controlling the power value extractable by the panel.

BRIEF DESCRIPTION OF THE FIGURES

Further features and advantages of the present invention will become clear from the detailed description that follows, given purely by way of non-limiting example with reference to the accompanying drawings, wherein.

DETAILED DESCRIPTION

Figure 1:
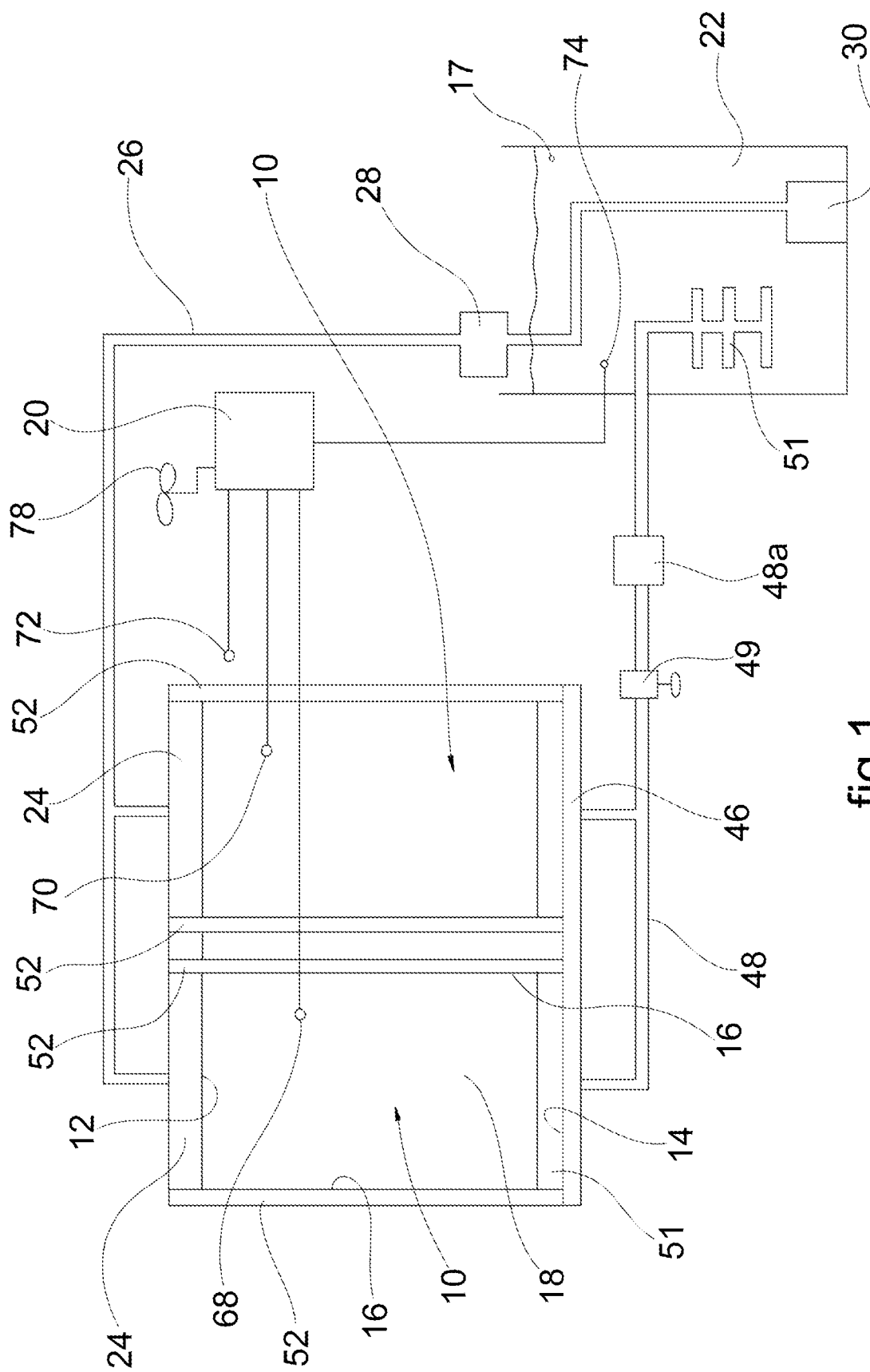
FIG. 1 is a schematic of a photovoltaic panel with associated cooling system according to a preferred embodiment of the present invention.

Referring initially to FIG. 1, 10 denotes photovoltaic panels, which are of a type known per se and will therefore not be described in detail here, provided with a cooling system according to the present invention. The panels 10 are conventionally arranged at a certain inclination with respect to the horizontal, and it is therefore possible to identify for each of them an upper edge 12, a lower edge 14, and a pair of lateral edges 16. The two edges, namely the upper edge 12 and lower edge 14, extend horizontally parallel to each other, while the two lateral edges 16 extend in respective vertical planes parallel to each other. The surface of the panel 10 exposed to solar light is denoted in FIG. 1 as 18 and will hereinafter be defined as the upper surface for simplicity. In the following description, for convenience, reference will be made to a single panel, although the cooling system according to the present invention is applied to a plurality of panels.

The cooling system according to the present invention comprises a water cooling assembly adapted to produce a cooling water flow which wets the upper surface 18 of the panel 10, an air cooling assembly adapted to blow air onto the upper surface 18 of the panel 10 (and/or onto its lower surface), a set of sensors and meters adapted to detect the temperature of the upper surface 18 of the panel 10 plus a series of other control parameters comprising the produced and absorbed electric powers, as explained in detail hereinbelow, and an electronic control unit 20 configured to automatically control the water cooling assembly and the air cooling assembly according to predetermined modes of operation based on the values of the control parameters measured by the aforesaid set of sensors.

The water cooling assembly comprises a tank 22 containing cooling water, a delivery device 24 mounted on the upper edge 12 of the panel 10, and a supply tubing 26 connecting the delivery device 24 to the tank 22. The water contained in the tank 22 is preferably rainwater, so as to prevent limescale that is normally present in water from the mains from being deposited on the upper surface 18 of the panel 10. The tank 22 will preferably be installed in a cool, dry environment, such as a cellar, or underground in the case of ground-mounted photovoltaic power plants, in order to keep the water contained therein cool, and will be sized to provide an adequate reserve of cooling water during periods of low rainfall. A level sensor 17 connected with the electronic control unit 20 is associated with the tank 22. In any case, the tank 22 will preferably be connected to the water mains so as to ensure the operation of the cooling system even if the rainwater in the tank is depleted. For this purpose, the water cooling assembly preferably comprises a filtration device 28 arranged along the supply tubing 26 to filter the water fed from the tank 22 to the panel 10 so as to nullify or otherwise limit the amount of limescale present therein. The water cooling assembly further comprises a pump 30 driven by an electric motor, such as an electric submersible pump, arranged in the tank 22 to pump the cooling water contained therein to the delivery device 24 through the supply tubing 26. The motor of the pump 30 may be powered indifferently from the power grid or from the same photovoltaic system with which the cooling system is associated. The pump 30 is connected to the electronic control unit 20 to be controlled thereby according to the appropriate control logic described below.

Figure 2:
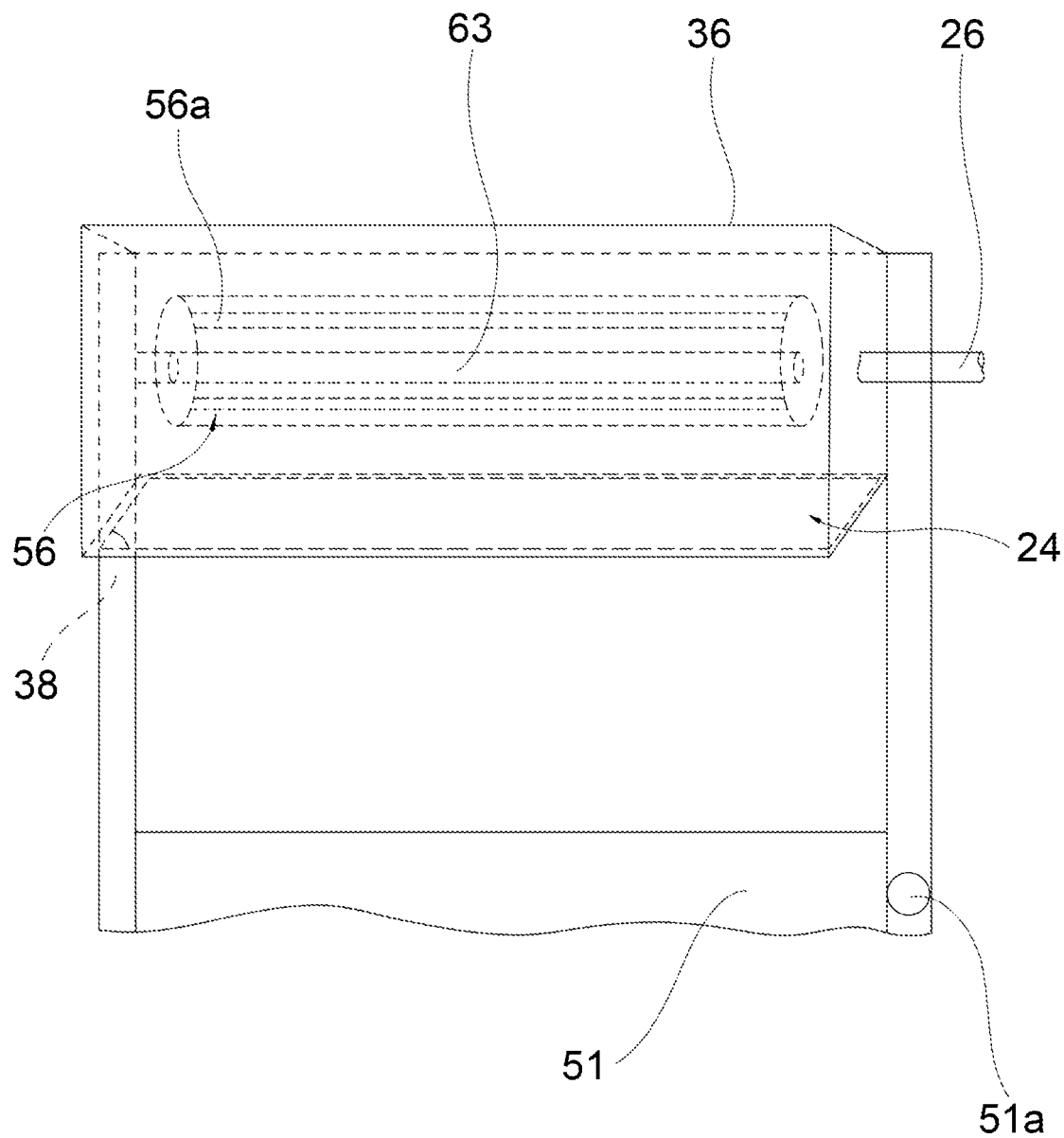
FIG. 2 is a schematic perspective view of a detail of the photovoltaic panel.

Referring to FIG. 2, the delivery device 24 comprises an enclosure 36 attached to the panel 10 near the upper edge 12 thereof. The enclosure 36 is made as a hollow body extended along a direction that in the assembled condition is oriented parallel to the upper edge 12 of the panel 10, and has a slot 38 extending along said direction.

The cooling water sent to the delivery device 24 from the pump 30 by means of the supply tubing 26 flows out through the slot 38 of the delivery device 24 and by gravity flows at low speed along the upper surface 18 of the panel 10, removing heat from said panel. The water cooling assembly is designed to ensure that the cooling water flow that wets the upper surface 18 of the panel 10 is as much as possible a laminar flow, and is therefore able to remove as much heat as possible from said panel.

The cooling water flowing from the delivery device 24 and flowing along the upper surface 18 of the panel is collected at the bottom of the panel by a channel 46, having, for example, a hemispherical or rectangular cross-section, fixed at the lower edge 14 of the panel, for example, by brackets and screws (not shown). The channel 46 is connected to the tank 22 by a return tubing 48, so that the cooling water collected at the bottom of the panel 10 flows into the tank 22. Since the cooling water is heated by flowing along the upper surface 18 of the panel 10, the water cooling assembly preferably comprises a coil 51 attached to the tank side end of the return tubing 48 to reduce the temperature of the cooling water returning from the panel 10. One or more operable relief valves 49 are arranged along the return tubing 48 to empty the tubing when necessary, for example to prevent water from freezing in the tubing. A filtration device 48a is also arranged along the return tubing 48 to filter the water coming from the panel 10 and to remove any residues present therein, e.g., dust, guano, leaves, etc.

The air cooling assembly comprises a fan 56 provided with blades 56a and driven by an electric motor (not shown), which is arranged to generate an air flow. In the example shown, the fan 56 is also arranged inside the enclosure 36, and thus allows air flow to be generated out of the enclosure 36 through the slot 38. According to alternative embodiments not shown, the fan 56 may be arranged in an enclosure which is separate from that of the water cooling assembly.

As already mentioned with regards to the pump 30, the electric motor of the fan 56 may also be indifferently powered by the power grid or by the photovoltaic system with which the cooling system is associated. The electric motor 62 is connected to the electronic control unit 20 to be controlled thereby according to the appropriate control logic described below. A potentiometer or dimmer (not shown) is also preferably coupled to the electric motor of the fan to enable the rotation speed of said electric motor, and thus of the fan 56, to be adjusted according to wind speed, for example.

For space reasons, for example, the air cooling assembly may also be mounted on the back side of the panel so that air is not blown on the upper surface of the panel but on the opposite lower surface.

Preferably, the cooling system according to the present invention also integrates a dirt cleaning apparatus. Referring to FIG. 1, this apparatus comprises a cleaning brush 51 capable of moving between the upper edge 12 and the lower edge 14 of the panel 10 and configured to apply a rubbing or scraping action to the upper surface 18 of the panel 10. Said cleaning brush 51 extends between the lateral edges 16 of the panel 10 so that it covers the entire width of the panel 10. The opposite ends of the cleaning brush 51 are provided with wheels 51a, which are in turn coupled to a pair of guides 52 respectively arranged on the lateral edges 16 of the panel 10. A motor (not shown) is associated with the cleaning brush 51 and adapted to move the cleaning brush 51 along the direction orthogonal to the upper and lower edges of the panel 10. This motor is also controlled by the electronic control unit 20.

Electric heating elements (not shown) are preferably arranged along the guides 52 and/or under the panel 10, which may be activated by the electronic control unit 20 to prevent ice formation or snow deposition, or to remove ice or snow already present.

Preferably, an electric generator 63 is also provided, the rotor of which is integral in rotation with the fan 56. The electric generator 63 is configured to produce energy by rotation of the fan 56; in this way, it is possible to recover a fraction of the mechanical energy that would otherwise be dissipated by the fan 56. The electricity produced by the generator 13 may be used to drive the motor of the cleaning brush 51 and/or to supply current to the electric heating elements for melting snow or ice. Further, there is preferably a storage battery (not shown) configured to store energy supplied by the electric generator 13, by the panel 10, or by an external grid. The storage battery is used for starting the motor of the fan 56.

In the example shown in FIG. 1, there is a single water cooling assembly associated with multiple panels, an air cooling assembly associated with each of the panels, respectively, and a single electronic control unit provided to manage the cooling and cleaning of the various panels. According to alternative embodiments, a relevant water cooling assembly, a relevant air cooling assembly, and a relevant electronic control unit may be provided for each panel.

Referring to FIG. 1, the set of sensors and meters forming part of the cooling system according to the present invention preferably comprises the following sensors: a first temperature sensor 68 adapted to detect the temperature of the upper surface 18 of the panel 10, a second temperature sensor 70 adapted to detect the temperature of the opposite lower surface of the panel 10, a third temperature sensor 72 adapted to detect the ambient temperature, a fourth temperature sensor 74 adapted to detect the temperature of the cooling water in the tank 22, and a wind speed sensor 78. The set of sensors and meters that are part of the cooling system according to the present invention further comprises the following meters: a produced power meter adapted to measure the electric power produced as output by the panel 10, a first absorbed power meter adapted to measure the electric power absorbed as input by the motor of the fan 56, and a second absorbed power meter adapted to measure the electric power absorbed as input by the motor of the pump 30. All of the sensors and meters mentioned above are connected to the electronic control unit 20 to provide signals indicative of the parameters measured thereby. Based on these signals, the electronic control unit 20 controls the water cooling assembly and/or air cooling assembly according to the operating modes described hereinafter.

The principle on which the operation of the cooling system is based consists in activating the water cooling assembly and/or the air cooling assembly when the temperature of the panel 10, determined on the basis of the signals provided by the temperature sensors 68 and 70, exceeds a predetermined maximum allowable value. Further, the cooling system also operates by taking into account the difference between the temperature of the panel and the temperature of the cooling water in order to prevent the glass of the panel from suffering a thermal shock if placed in contact with cooling water having too low a temperature and consequently becoming brittle or even breaking. For this purpose, the electronic control unit 20 monitors the temperature difference between the panel and cooling water and controls the water and air cooling assemblies according to the value of this temperature difference. More precisely, as long as the temperature difference between the panel and the cooling water does not exceed a given threshold, the electronic control unit 20 commands, as needed, that is, as soon as the temperature of the panel 10 exceeds the predetermined maximum allowable value, the activation of only the water cooling assembly. If, on the other hand, the temperature difference between the panel and the cooling water exceeds this threshold, then the electronic control unit 20 commands, as needed, that is, as soon as the temperature of the panel 10 exceeds the predetermined maximum allowable value, the activation sequentially first of only the air cooling assembly, then of only the water cooling assembly, and finally again of only the air cooling assembly. In fact, the initial activation of the air cooling assembly alone allows the temperature of the panel, and thus the temperature difference between the panel and cooling water, to be reduced.

Sequential activation first of the air cooling assembly, then of the water cooling assembly, and finally again of the air cooling assembly is managed by the electronic control unit based on the signals provided by the produced power meter, the first absorbed power meter, and the second absorbed power meter.

In particular, the sequential activation comprises the following steps:
a) switching on the fan 56,
b) calculating, from a time T1 after the fan 56 has been switched on, the difference $\Delta P1$ between the electric power Pout produced as output by the panel 10 and the electric power P1in absorbed as input by the motor of the fan 56 (which hereinafter will be called the first power difference), based on the signals received from the produced power meter and the first absorbed power meter,
c) keeping the fan in operation during a first time interval $\Delta t1$ after the fan has been switched on, during which said first power difference is negative (in fact, there is a peak in power consumption when the fan is switched on, while the cooling effect is obtained after some time),
d) in a second time interval $\Delta t2$ following the first time interval $\Delta t1$, keeping the fan 56 in operation until the first power difference $\Delta P1$ is positive,
e) when the first power difference $\Delta P1$ drops to zero, switching off the fan 56 and switching on the pump 30,
f) calculating, from a time T2 after the pump 30 has been switched on, the difference $\Delta P2$ between the electric power Pout produced as output by the panel 10 and the electric power P2in absorbed as input by the motor of the pump 30 (which hereinafter will be called the second power difference), based on the signals received from the produced power meter and from the second absorbed power meter,
g) keeping the pump in operation during a first time interval $\Delta T1$ after the pump has been switched on, in which said second power difference is negative (in fact, there is a peak power consumption after the pump has been switched on, while the cooling effect is obtained after some time), h) in a second time interval ΔT2 following the first time interval ΔT1, keeping the pump 30 in operation until said second power difference ΔP2 is positive, i) when the second power difference ΔP2 drops to zero, switching off the pump and switching on the fan 56.

The first time interval Δt1 related to the operation of the fan 56 is given by Δt1=t1−t0, where t0 is the instant in which the fan 56 is switched on, and t1 the instant in which the equilibrium between the electric power Pout produced as output by the panel and the electric power P1in absorbed as input by the motor of the fan 56 is reached, and thus the first power difference ΔP1 has risen from negative values to zero. The second time interval Δt2 relative to the operation of the fan 56 is given by Δt2=t2−t1, where t2 is the instant in which the first power difference ΔP1 returns to zero.

The first time interval ΔT1 relative to the operation of the pump 30 is given by ΔT1=T1−T0, where T0 is the instant in which the pump 30 is switched on (approximately coincident with the instant in which the fan 56 is switched off, or at any rate very close thereto, and in any case subsequent to the instant t2) and T1 the instant in which equilibrium is reached between the electric power Pout produced as output by the panel and the electric power P2in absorbed as input by the motor of the pump 30, and thus the second power difference ΔP2 has risen from negative values to zero. The second time interval ΔT2 relative to the operation of the pump 30 is given by ΔT2=T2−T1, where T2 is the instant in which the second power difference ΔP2 returns to zero.

Preferably, in step f) the pump 30 is kept in motion intermittently. In other words, during the time interval ΔT=ΔT1+ΔT2, it is not necessary to keep the pump on continuously: it is sufficient to operate it according to a cadence of "on" sub-intervals interspersed with "off" sub-intervals having a duration shorter than the "on" sub-intervals, during which the power remains constant by thermal inertia.

Preferably, step a) provides for switching on the fan 56 with a rotation speed v(t) having a minimum initial value v0, and step c) provides for modulating the rotation speed v(t) of the fan 56 from the minimum value so that v(t>t0)>v0.

Preferably, step d) provides for switching on the pump 30 with a rotation speed V(T) having a minimum value V0, and step f) provides for modulating the rotation speed V(T) of the pump 30 from the minimum value so that V(T>T0)>V0.

What is claimed is:

1. A method for controlling a cooling system for photovoltaic panels, the cooling system comprising:

an air cooling assembly adapted to produce an air flow directed against an upper surface of a photovoltaic panel, exposed to solar light, or against a lower surface of the photovoltaic panel, opposite to the upper surface, said air cooling assembly comprising a fan driven by a first electric motor, a water cooling assembly adapted to produce a cooling water flow wetting said upper surface of the photovoltaic panel exposed to the solar light, said water cooling assembly comprising a pump driven by a second electric motor, and measuring means comprising a produced power meter adapted to measure electric power Pout produced as output by the photovoltaic panel, a first absorbed power meter adapted to measure electric power P1in absorbed as input by the first electric motor, and a second absorbed power meter adapted to measure electric power P2in absorbed as input by the second electric motor, wherein the method comprises the steps of:

a) switching on the fan, b) calculating a difference ΔP1 between the electric power Pout produced as output by the photovoltaic panel and the electric power P1in absorbed as input by the first electric motor, hereinafter a first power difference, based on signals received from the produced power meter and from the first absorbed power meter, c) keeping the fan in operation during a first time interval Δt1 after the fan has been switched on, during which said first power difference is negative, d) in a second time interval Δt2 following the first time interval Δt1, after said first power difference has transitioned from a negative first power difference to a positive first power difference, keeping the fan in operation until said first power difference is positive, e) when the first power difference drops to zero from said positive first power difference, switching off the fan and switching on the pump, f) calculating a difference ΔP2 between the electric power Pout produced as output by the photovoltaic panel and the electric power P2 in absorbed as input by the second electric motor, hereinafter second power difference, based on signals received from the produced power meter and from the second absorbed power meter, g) keeping the pump in operation during a first time interval ΔT1 after the pump has been switched on, during which said second power difference is negative, h) in a second time interval ΔT2 following the first time interval ΔT1, after said second power difference has transitioned from said negative second power difference to said positive second power difference, keeping the pump in operation until said second power difference is positive, and i) when the second power difference drops to zero from said positive second power difference, switching off the pump and switching on the fan.

2. The method of claim 1, wherein in step f) the pump is kept in operation in an intermittent manner.

3. The method of claim 1, wherein step a) comprises switching on the fan with a rotation speed having a minimum value, and step c) comprises modulating said rotation speed from the minimum value.

4. The method of claim 1, wherein step d) comprises switching on the pump with a rotation speed having a minimum value, and step f) comprises modulating said rotation speed from the minimum value.

5. A cooling system for photovoltaic panels, the cooling system comprising:

an air cooling assembly adapted to produce an air flow directed against an upper surface of a photovoltaic panel, exposed to solar light, or against a lower surface of the photovoltaic panel, opposite to the upper surface, said air cooling assembly comprising a fan driven by a first electric motor, a water cooling assembly adapted to produce a cooling water flow wetting the upper surface of the photovoltaic panel exposed to the solar light, said water cooling assembly comprising a pump driven by a second electric motor, and measuring means comprising a produced power meter adapted to measure electric power Pout produced as output by the photovoltaic panel, a first absorbed power meter adapted to measure electric power P1in absorbed as input by the first electric motor, and a second absorbed power meter adapted to measure electric power P2in absorbed as input by the second electric motor, wherein said cooling system is configured to carry out the method of claim 1.

6. The cooling system of claim 5, further comprising an electric generator having a rotor integral in rotation with the fan, said electric generator being configured to produce electric power by rotation of the fan, and a storage battery configured to store energy supplied by the electric generator, by the photovoltaic panel or by an external grid, the storage battery being used for starting the first electric motor.

7. The cooling system of claim 5, further comprising a motor-driven cleaning brush movable between an upper edge and a lower edge of the photovoltaic panel and configured to apply a rubbing or scraping action to the upper surface of the photovoltaic panel, said motor-driven cleaning brush being coupled to a pair of guides arranged at lateral edges of the photovoltaic panel, respectively.

\* \* \* \* \*